(12) United States Patent
Luo et al.

(10) Patent No.: US 10,600,998 B2
(45) Date of Patent: Mar. 24, 2020

(54) DISPLAY APPARATUS AND METHOD OF MANUFACTURING THEREOF

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Hongqiang Luo, Beijing (CN); Jianjun Wu, Beijing (CN)

(73) Assignees: BOE TECHNOLOGY GROUP CO., LTD., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 16/099,496

(22) PCT Filed: Apr. 24, 2018

(86) PCT No.: PCT/CN2018/084221
§ 371 (c)(1),
(2) Date: Nov. 7, 2018

(87) PCT Pub. No.: WO2019/095630
PCT Pub. Date: May 23, 2019

(65) Prior Publication Data
US 2019/0148677 A1    May 16, 2019

(30) Foreign Application Priority Data

Nov. 14, 2017  (CN) .......................... 2017 1 1124058

(51) Int. Cl.
*H01L 21/00*     (2006.01)
*H01L 51/52*     (2006.01)
(Continued)

(52) U.S. Cl.
CPC ........ *H01L 51/5281* (2013.01); *H01L 27/323* (2013.01); *H01L 51/0097* (2013.01); *H01L 2251/5338* (2013.01); *H01L 2251/566* (2013.01)

(58) Field of Classification Search
CPC combination set(s) only.
See application file for complete search history.

(56) References Cited

U.S. PATENT DOCUMENTS

2005/0238852 A1* 10/2005 Nakayama ................. C09J 7/20
                                                              428/192
2016/0025909 A1*  1/2016 Yeo ........................ G02B 5/305
                                                              428/1.31
2018/0309086 A1  10/2018 Li et al.

FOREIGN PATENT DOCUMENTS

CN         1946553 A     4/2007
CN       102346321 A     2/2012
(Continued)

OTHER PUBLICATIONS

International Search Report dated Aug. 16, 2018, issued in counterpart Application No. PCT/CN2018/084221 (9 pages).
(Continued)

*Primary Examiner* — Robert G Bachner
(74) *Attorney, Agent, or Firm* — Westerman, Hattori, Daniels & Adrian, LLP

(57) ABSTRACT

The present disclosure is related to a method of manufacturing a display apparatus. The method of manufacturing the display apparatus may include providing a polarizer and a display panel, aligning and bonding the second reserved portion of the display panel with the first reserved portion of the polarizer, and cutting at least the polarizer along a boundary of the second reserved portion. The polarizer may include a first reserved portion and a first to-be-removed portion. The display panel may include a second reserved (Continued)

portion and a second to-be-removed portion. The width of the first to-be-removed portion may be not smaller than a first width, and the width of the second-to-be-removed portion is smaller than the first width.

15 Claims, 4 Drawing Sheets

(51) Int. Cl.
*H01L 27/32* (2006.01)
*H01L 51/00* (2006.01)

(56) References Cited

FOREIGN PATENT DOCUMENTS

| | | | |
|---|---|---|---|
| CN | 103294237 | A | 9/2013 |
| CN | 104656988 | A | 5/2015 |
| CN | 106526913 | A | 3/2017 |
| CN | 106556947 | A | 4/2017 |
| CN | 106681031 | A | 5/2017 |
| CN | 106875851 | A | 6/2017 |
| CN | 107065273 | A | 8/2017 |

OTHER PUBLICATIONS

Office Action dated Dec. 11, 2019, issued in counterpart CN application No. 201711124058.7, with English translation. (19 pages).

* cited by examiner

DISPLAY APPARATUS AND METHOD OF MANUFACTURING THEREOF

CROSS-REFERENCE TO RELATED APPLICATIONS

This application claims benefit of the filing date of Chinese Patent Application No. 201711124058.7 filed on Nov. 14, 2017, the disclosure of which is herein incorporated by reference.

TECHNICAL FIELD

This invention relates to display technology, and more particularly, to a method of manufacturing a display apparatus and a display apparatus manufactured by the method thereof.

BACKGROUND

In a process of manufacturing a display device such as an organic electroluminescent touch display device, it is necessary to sequentially bond a touch layer to a polarizer, a display panel to the touch layer, and a cover plate to the polarizer. In each bonding process, there is a certain fit tolerance, which accordingly can cause a wide frame for the display device. At present, it increases production cost to realize a narrow frame.

BRIEF SUMMARY

Accordingly, one example of the present disclosure is a method of manufacturing a display apparatus. The method of manufacturing a display apparatus may include providing a polarizer and a display panel, the polarizer including a first reserved portion and a first to-be-removed portion surrounding the first reserved portion and the display panel including a second reserved portion and a second to-be-removed portion surrounding the second reserved portion, aligning and bonding the second reserved portion of the display panel with the first reserved portion of the polarizer, and cutting at least the polarizer along a boundary of the second reserved portion. A width of the first to-be-removed portion may not be smaller than a first width, and a width of the second-to-be-removed portion may be smaller than the first width. The polarizer may include a polarizer body, an adhesive layer on the polarizer body, and a release film covering the adhesive layer. The width of the second to-be-removed portion may be greater than a second width, and the width of the first to-be-removed portion may not be less than a sum of the first width and the second width.

Before aligning the second reserved portion of the display panel with the first reserved portion of the polarizer, the method may further include providing a touch layer, the touch layer including a third reserved portion and a third to-be-removed portion surrounding the third reserved portion, and aligning and bonding the third reserved portion of the touch layer and the first reserved portion of the polarizer. A width of the third to-be-removed portion may be less than the first width and greater than a sum of a third width and the second width, and the width of the first to-be-removed portion may not be less than a sum of the first width, the second width, and the third width. Aligning and bonding the third reserved portion of the touch layer and the first reserved portion of the polarizer may include removing the release film in a first to-be-removed inner portion and the first reserved portion of the polarizer, and the first to-be-removed portion including the first to-be-removed inner portion and a first to-be-removed outer portion, and aligning the third reserved portion of the touch layer with the first reserved portion of the polarizer and bonding the touch layer with an exposed part of the adhesive layer on the polarizer. A width of the first to-be-removed inner portion may be greater than a sum of the width of the third to-be-removed portion and the third width.

Aligning and bonding the second reserved region of the display panel with the first reserved region of the polarizer may include aligning and bonding the second reserved portion of the display panel and the third reserved portion of the touch layer.

Cutting at least the polarizer along the boundary of the second reserved region by the cutting technique may include simultaneously cutting the display panel, the touch layer, and the polarizer.

In one embodiment, the first width may be between 4 mm and 5 mm, the second width may be between 0.1 mm and 0.2 mm, and the width of the second to-be-removed portion of the display panel may be between 0.3 mm and 1 mm. In one embodiment, the width of the second to-be-removed portion of the display panel may be about 0.5 mm.

In another embodiment, the first width may be between 4 mm and 5 mm, the third width may be between 0.28 mm and 0.3 mm, the second width may be between 0.1 mm and 0.2 mm, and the width of the first to-be-removed region may be between 5 mm and 6 mm. In one embodiment, the first width may be about 4 mm, the third width may be about 0.3 mm, the second width may be about 0.15 mm, and the width of the first to-be-removed portion may be about 5 mm. The width of the third to-be-removed portion may be about 0.5 mm. The width of the third to-be-removed portion of the touch layer may be about 0.5 mm and the width of the first to-be-removed inner portion may be about 1 mm.

Aligning and bonding the second reserved portion of the display panel and the third reserved portion of the touch layer may include providing an adhesive layer on the touch layer, aligning the second reserved portion of the display panel with the third reserved portion of the touch layer and bonding the display panel and the adhesive layer by the bonding technique. The display panel may be a flexible OLED display panel.

The method may further include bonding a cover plate with the polarizer on a side of the polarizer away from the display panel.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
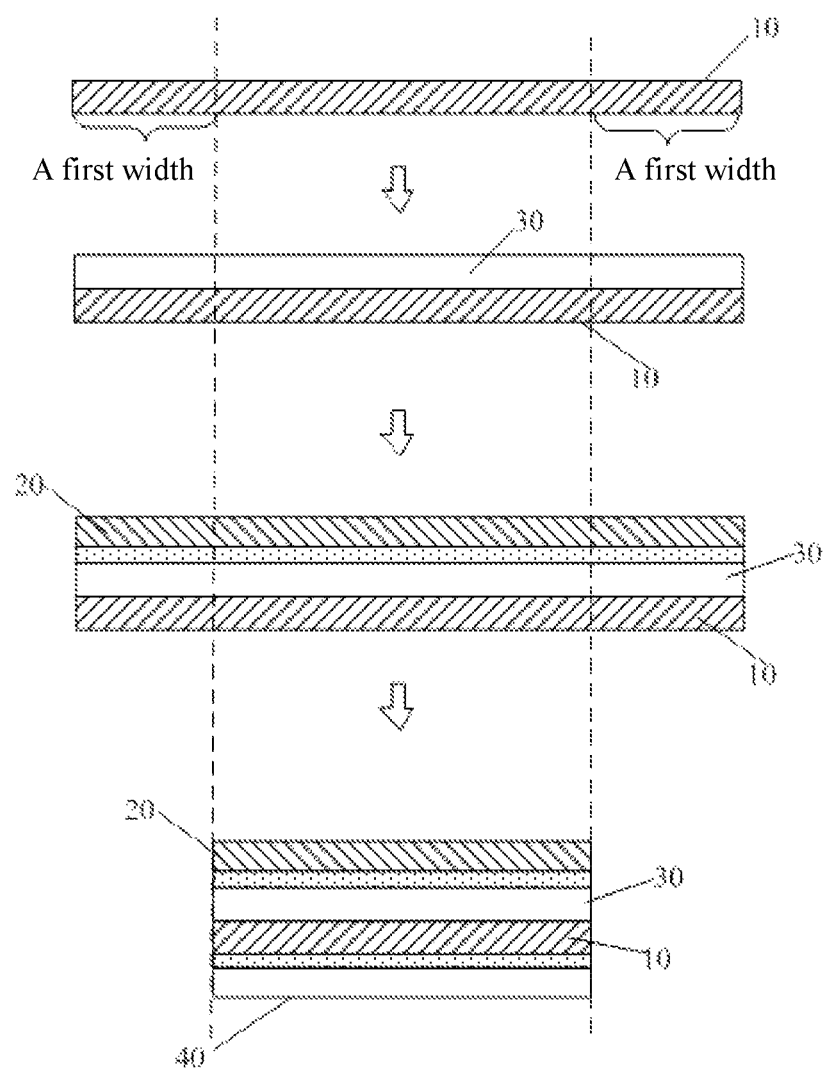
FIG. 1 is a schematic structural diagram of a method of manufacturing a display apparatus in the prior art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-4. When referring to the figures, like structures and elements shown throughout are indicated with like reference numerals.

In this specification, numerical terms such as "first," "second," etc. may be added as prefixes. These prefixes, however, are only added in order to distinguish the terms and do not have specific meaning such as order and relative merits.

A numerical value modified by the term "about" as used herein means that the numerical value can vary by 10% therefrom.

In an embodiment of a process of manufacturing a display apparatus, a cover plate, a touch layer, a display panel, and a polarizer are first prepared according to the size of the display apparatus to be manufactured. Then, the touch layer is disposed on the polarizer and bonded with the polarizer, and then the display panel is disposed on the touch layer and bonded with the touch layer. Finally, the polarizer is disposed on the cover plate and attached to the cover plate. For example, when fitting tolerance of each bonding is 0.3 mm, that is, the actual position fluctuates between [−0.15 mm, +0.15 mm] from a target position as a reference position, the display apparatus will generate a border of 0.45 mm, which is not conducive to realization of narrow borders.

FIG. 1 is a schematic structural diagram of a method of manufacturing a display apparatus in prior art. First, the polarizer 10, the display panel 20, the touch layer 30, and the cover plate 40 are fabricated. The length and the width of the polarizer 10 are respectively greater than the length and the width of the display apparatus to be manufactured. The middle part of the polarizer 10 is a reserved portion, which has the same shape and size as the display apparatus to be fabricated. There is a region having a first width, which is a reserved waste discharge width (typically 4 mm), between each side of the polarizer 10 and the reserved portion. The touch layer and the display panel 20 each have the same size and shape as the polarizer 10. The size and shape of the cover plate 40 are the same as those of the display device to be manufactured. During the bonding, as shown in FIG. 1, the touch layer 30 is first bonded to the polarizer 10. Then, the display panel 20 and the touch layer 30 are bonded together. Thereafter, the touch layer 30, the display panel 20 and the polarizer 10, which are bonded together, are cut longitudinally along the boundary of the reserved portion, that is, along the dotted line in FIG. 1, to eliminate the fit tolerance of previous bonding processes. Finally, the cover plate 40 is attached to the polarizer 10 to obtain the desired display apparatus. The reason for having a region of the first width, the reserved waste discharge width, between each side of the polarizer and the reserved portion is that, during cutting, the workpiece to be cut is adsorbed on the base table. Since there is a certain distance between the adsorption holes, if the width of the cut waste is too small, the cut waste cannot be adsorbed. Furthermore, the cutting process will produce a certain amount of heat. If the width of the region is too small, the heat generated by the cutting will cause portions of the display panel 20, the touch layer 30, and the polarizer 10 outside the reserved portion to warp, thereby affecting the cutting accuracy.

In the manufacturing method of FIG. 1, the border of the display apparatus is 0.15 mm, and accordingly the border is reduced. However, because the sizes of the display panel 20 and the touch layer 30 before the cutting are large, where a display motherboard has a fixed size, the number of the display panels 20 cut from the display motherboard will decrease, thereby resulting in an increase in cost of a single display panel 20. Similarly, the cost of a single touch layer 30 also increases, thereby increasing manufacturing cost of the display apparatus.

Figure 2:
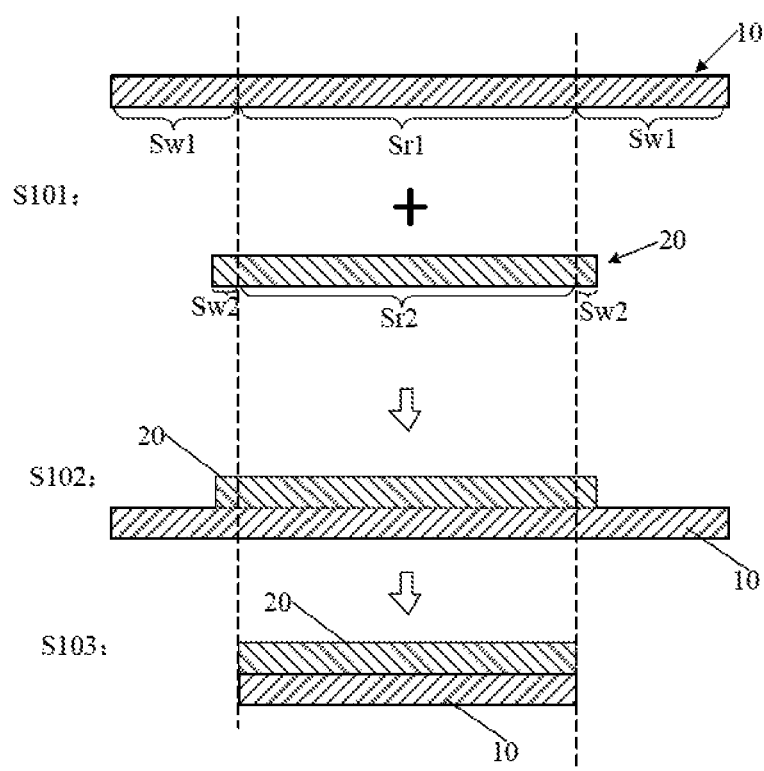
FIG. 2 is a schematic structural diagram of a method of manufacturing a display apparatus according to one embodiment of the present disclosure.

FIG. 2 is a schematic structural diagram of a method of manufacturing a display apparatus provided in an embodiment of the present disclosure. In one embodiment, the manufacturing method includes:

In step S101, a polarizer 10 and a display panel 20 are provided, and the polarizer is divided into a first reserved portion Sr1 and a first to-be-removed portion Sw1 surrounding the first reserved portion Sr1. The first reserved portion Sr1 has the same size and shape as the display apparatus. The display panel 20 includes a second reserved portion Sr2. The size and shape of the second reserved portion Sr2 are the same as those of the first reserved portion Sr1. As used herein, the term "size" includes length and width.

In step S102, the second reserved portion Sr2 of the display panel 20 is aligned with the first reserved portion Sr1 of the polarizer 10, and the display panel 20 and the polarizer are bonded together.

In step S103, at least the polarizer 10 is cut along the boundary of the second reserved portion Sr2 by a cutting technique. In one embodiment, a width of the first to-be-removed portion Sw1 is not less than the first width, which is a reserved waste discharge width of the cutting technique. The boundary of the second reserved portion Sr2 coincides with the boundary of the display panel 20, or there is a region between the boundary of the second reserved portion and the boundary of the display panel and that region has a width smaller than the first width, the reserved waste discharge width of the cutting technique. The first width or the reserved waste discharge width is a minimum width set in the cutting technique to ensure that the cut waste can be adsorbed on the cutting machine table and prevented from warping during the cutting. In one embodiment, if the first to-be-removed portion Sw1 is a ring, the width of the first to-be-removed portion Sw1 is the shortest distance between the inner ring and the outer ring.

The manufacturing method of the present disclosure can be used to fabricate an Organic Light-Emitting Diode (OLED) display device. In this case, the polarizer 10 is a circular polarizer that is used to eliminate the influence of external light on the display screen.

In the method of manufacturing the display apparatus according to the present embodiment, the display panel 20 and the polarizer 10 are bonded together and then cut along the boundary of the second reserved portion Sr2. Therefore, even if the first reserved portion Sr1 and the second reserved portion Sr2 are misaligned during bonding, the end surfaces of the display panel 20 and the polarizer 10 are still flush with each other after being cut, which is conducive to realization of narrow borders. In addition, since the display panel 20 has been bonded with the polarizer 10 and the width of the first to-be-removed portion Sw1 on the polarizer 10 reaches a predetermined waste discharge width of the cutting technique, during cutting along the boundary of the second reserved portion Sr2, no warp occurs in either the display panel 20 or the polarizer 10. Furthermore, since the boundary of the second reserved portion Sr2 of the display panel 20 coincides with the boundary of the display panel 10 or there is a region having the width smaller than the reserved waste discharge width, compared with the embodiment in FIG. 1, the size of the display panel is reduced so that more display panels 20 can be manufactured per display motherboard, thereby reducing manufacturing cost of a single display panel 20. Furthermore, the cost of the polarizer 10 is far less than the cost of the display panel 20. Therefore, the larger size of the polarizer 10 has less effect on the overall cost of the display apparatus. Thus, the manufacturing method of the present disclosure can reduce the manufacturing cost of the display apparatus while realizing a narrow border.

For each cutting technique, there will usually be a certain cutting error, resulting in a certain error between the actual cutting line and the target cutting line. In one embodiment, in order to ensure that the end surface of the display panel 20 is flush with the end surface of the polarizer 10 after the cutting in step S103, a second to-be-removed portion Sw2 is formed between the second reserved portion Sr2 of the display panel 20 and the boundary of the display panel 20. The second to-be-removed portion Sw2 surrounds the second reserved portion Sr2. The width of the second to-be-removed portion Sw2 is greater than a second width, which is the maximum cutting error of the cutting technique, and the width of the first to-be-removed portion Sw1 is not less than the sum of the first width and the second width, that is, the sum of the reserved waste discharge width and the maximum cutting error. In one embodiment, similar to the first to-be-removed portion Sw1, the second to-be-removed portion Sw2 is also in a ring shape, and the width of the second to-be-removed portion Sw2 is the shortest distance between the inner ring and the outer ring. "The maximum cutting error of the cutting technique" refers to the maximum amount of deviation that may occur between the actual cutting line and the target cutting line when cutting with the cutting technique.

Since the width of the second to-be-removed portion Sw2 is greater than the maximum cutting error of the cutting technique, even if the actual cutting line deviates during cutting, the display panel 20 is still to be cut to form flush cutting surfaces. Moreover, since the width of the first to-be-removed portion Sw1 is not less than the sum of the reserved waste discharge width and the maximum cutting error, even if the actual cutting line at the time of cutting deviates, the distance between the actual cutting line and the boundary of the polarizer 10 is not less than the reserved waste discharge width so as to ensure that the edges of the display panel 20 and the polarizer 10 do not warp.

In one embodiment, the reserved waste discharge width is between 4 mm and 5 mm, the maximum cutting error is between 0.1 mm and 0.2 mm, and the width of the second to-be-removed portion Sw2 of the display panel 20 is between 0.3 mm and 1 mm. In one embodiment, the width of the second to-be-removed portion Sw2 is 0.5 mm, thereby improving the cutting effect while reducing the cost of the display apparatus.

Figure 3:
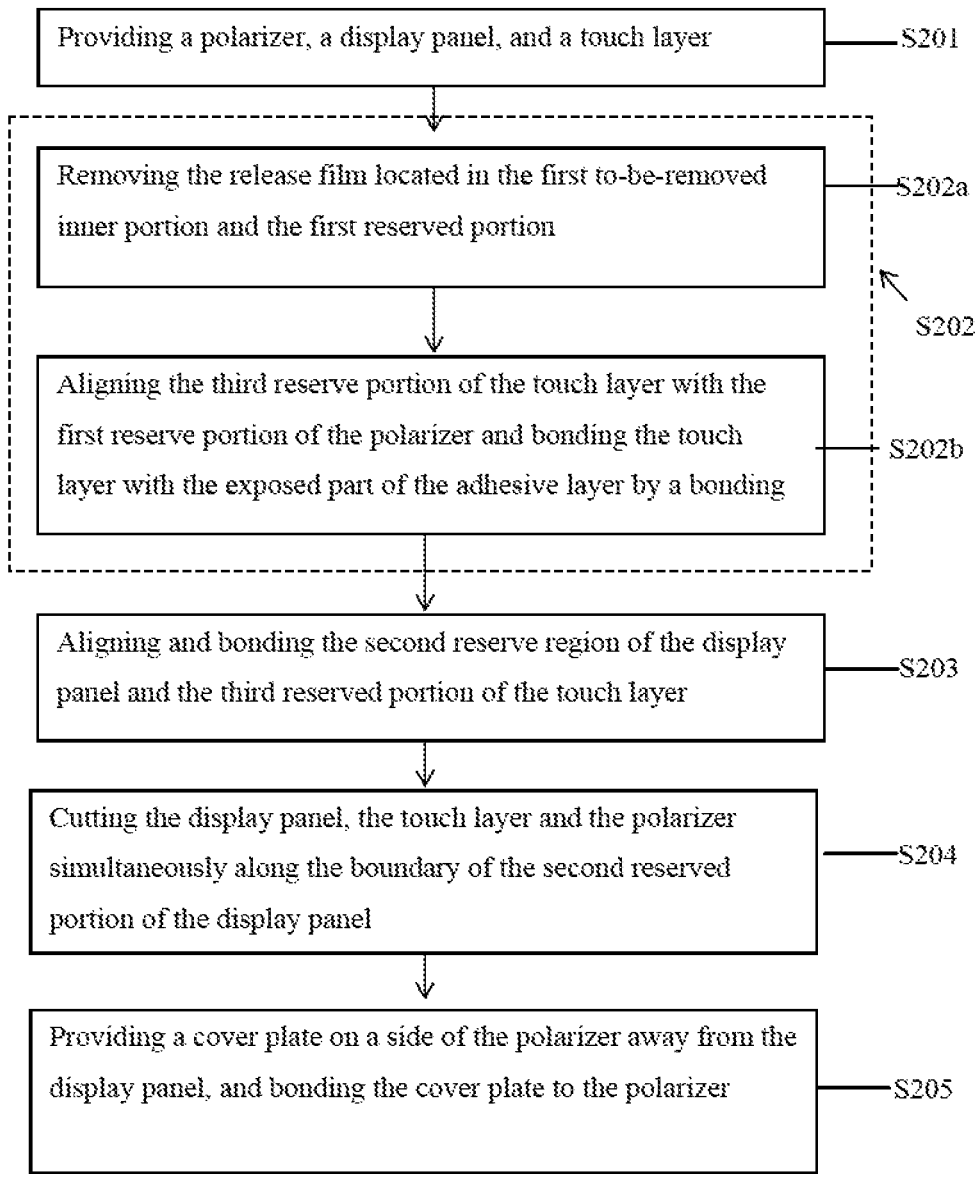
FIG. 3 is a flow chart of a method of manufacturing a touch display apparatus according to one embodiment of the present disclosure.
Figure 4:
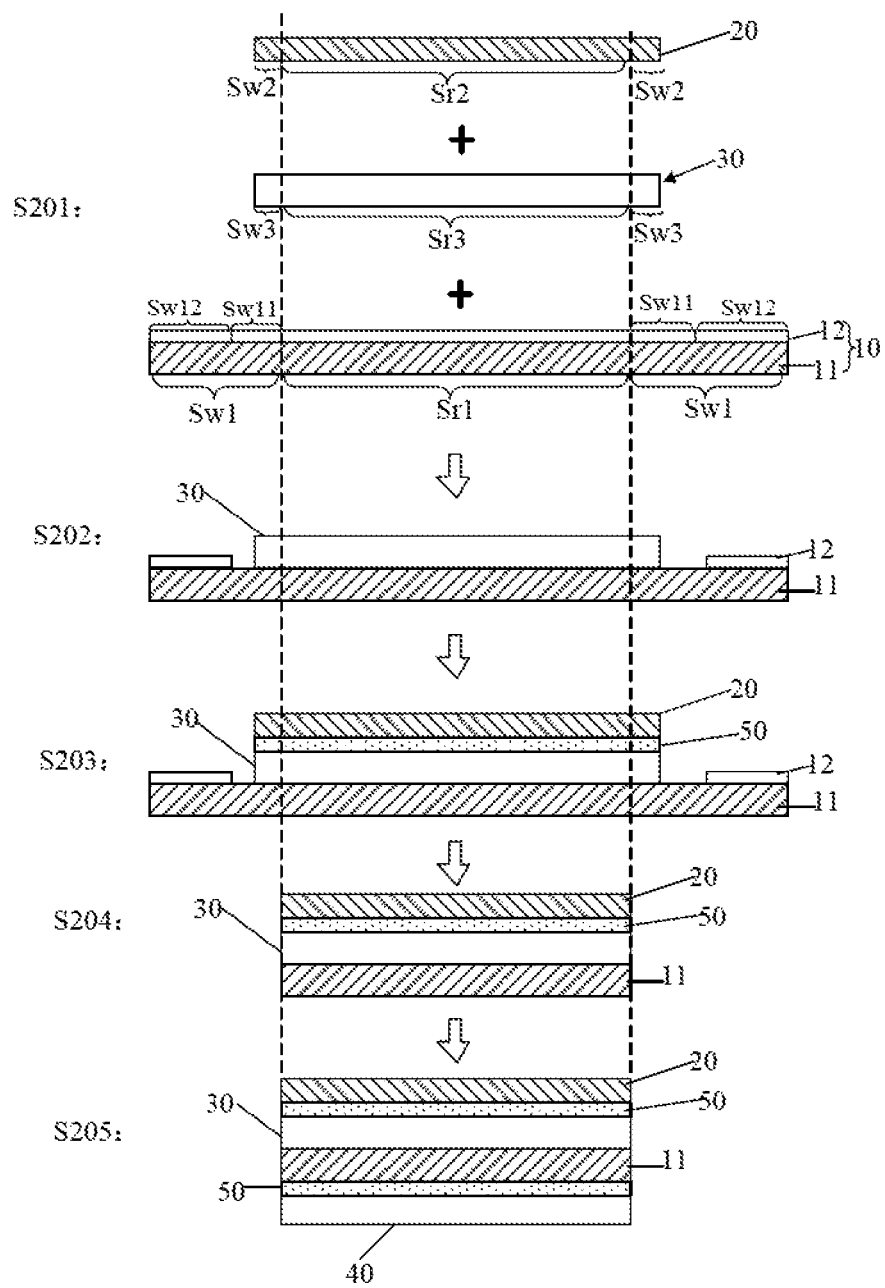
FIG. 4 is a schematic structural diagram corresponding to each of the steps in FIG. 3.

FIG. 3 is a flowchart of a method of manufacturing a touch display apparatus according to one embodiment of the present disclosure. FIG. 4 is a schematic structural diagram corresponding to each step in FIG. 3. As shown in FIG. 3 and FIG. 4, the manufacturing method includes the following steps S201 to S205:

In step S201, a polarizer 10, a display panel 20, and a touch layer 30 are provided. In one embodiment, the polarizer 10 is divided into a first reserved portion Sr1 and a first to-be-removed portion Sw1 surrounding the first reserved portion Sr1. The first to-be-removed portion Sw1 includes a first to-be-removed inner portion Sw11 surrounding the first reserved portion Sr1 and a first to-be-removed outer portion Sw12 surrounding the first to-be-removed inner portion Sw11. The polarizer 10 includes a polarizer body 11, an adhesive layer disposed on the polarizer body 11, and a release film 12 covering the adhesive layer.

The display panel 20 is a flexible OLED display panel that includes a second reserved portion Sr2 and a second to-be-removed portion Sw2 surrounding the second reserved portion Sr2.

The touch layer 30 is divided into a third reserved portion Sr3 and a third to-be-removed portion Sw3 surrounding the third reserved portion Sr3. The sizes and shapes of the third reserved portion Sr3 and the first reserved portion Sr1 are the same.

In step S202, the third reserved portion Sr3 of the touch layer 30 is aligned and bonded with the first reserved portion Sr1 of the polarizer 10 by a bonding technique. In one embodiment, the step specifically includes step S202a of removing a part of the release film 12 located in the first to-be-removed inner portion Sw11 and the first reserved portion Sr1 while keeping the part of the release film 12 intact in the first to-be-removed outer portion Sw12. In step S202b, the third reserved portion Sr3 of the touch layer 30 is aligned with the first reserved portion Sr1 of the polarizer 10 by a bonding technique, and the touch layer 30 is bonded with the exposed part of the adhesive on the polarizer 10.

The release film 12 in the first to-be-removed outer portion Sw12 can prevent the adhesive from adhering to foreign substance. The release film 12 in the first to-be-removed inner portion Sw11 is removed in order to prevent the touch layer 30 from contacting the remaining release film 12 in the first to-be-removed outer portion Sw12. Thus, the width of the first to-be-removed inner portion Sw11 is greater than the sum of the width of the third to-be-removed portion Sw3 and a third width, which is the fit tolerance of the bonding process. The specific widths of the third to-be-removed portion Sw3 and the first to-be-removed inner portion Sw11 will be described later, and will not be mentioned here.

In step S203, the second reserved portion Sr2 of the display panel 20 is aligned with the first reserved portion Sr1 of the polarizer 10 and the display panel 20 and the polarizer are bonded together. In one embodiment, the second reserve portion Sr2 of the display panel and the third reserved portion Sr3 of the touch layer 10 are aligned and bonded by the bonding technique so that the display panel 20 is attached to the polarizer 10 through the touch layer 30. In one embodiment, the step S203 further includes disposing an adhesive layer 50 on the touch layer 30. Then, the second reserved portion Sr2 of the display panel 20 is aligned with the third reserved portion Sr3 of the touch layer 30, and the display panel 20 and the adhesive layer 50 are bonded to each other.

In step S204, the display panel 20, the touch layer 30, and the polarizer 10 are simultaneously cut along the boundary of the second reserved region Sr2 of the display panel 20 by the cutting technique.

In step S205, a cover plate 40 is provided on a side of the polarizer 10 away from the display panel 20, and the cover plate 40 is attached to the polarizer 10. The cover plate can have the same size and shape as those of the first reserved portion Sr1 of the polarizer 10, and the desired display apparatus is obtained after step S205.

In one embodiment, the width of the second to-be-removed portion Sw2 of the display panel 20 is greater than the second width, the maximum cutting error of the cutting technique, so as to ensure that the display panel 20 can be cut even if the cutting line deviates during the cutting. The maximum cutting error is the calibration value on the cutting device. In one embodiment, as described above, the width of the second to-be-removed portion Sw2 is 0.5 mm.

In one embodiment, the width of the first to-be-removed portion Sw1 is not less than the sum of the reserved waste discharge width, the fit tolerance, and the maximum cutting error. The "fit tolerance" in the present disclosure is the calibration tolerance of the bonding apparatus, and specifically refers to the difference between the maximum value and the minimum value of the actual bonding position during bonding. For example, taking the target bonding position as a reference position, the maximum and minimum actual bonding positions are respectively ±a, and the bonding tolerance is 2a. When the width of the first to-be-removed portion Sw1 is not less than the sum of the reserved waste discharge width, the fit tolerance, and the maximum cutting error, even if the maximum deviation occurs during each bonding process and cutting process, at least a predetermined waste discharge width may remain between the actual cutting line and the edge of the polarizer 10 to ensure presence of a normal reserved waste discharge width of the cutting technique, thereby preventing the edge of the polarizer 10 from warping and influencing cutting accuracy.

In one embodiment, the reserved waste discharge width is between 4 mm and 5 mm, the fit tolerance is between 0.28 mm and 0.3 mm, the maximum cutting error is between 0.1 mm and 0.2 mm, and the width of the first to-be-removed portion is between 5 mm and 6 mm.

In one embodiment, the reserved waste discharge width is 4 mm, the fit tolerance is 0.3 mm (the maximum and the minimum of the actual bonding position are ±0.15 mm respectively), and the maximum cutting error is 0.15 mm. The width of the first to-be-removed portion is 5 mm so as to reduce the size of the polarizer 10 as much as possible, thereby reducing the manufacturing cost of the polarizer 10.

In one embodiment, the width of the third to-be-removed portion Sw3 of the touch layer 30 is less than the reserved waste discharge width and greater than the sum of the fit tolerance of the bonding technique and the maximum cutting error. Compared with the embodiment shown in FIG. 1, the size of the touch layer 30 is reduced, thereby reducing the manufacturing cost of the touch layer 30 and accordingly reducing the cost of the display apparatus. Moreover, since the width of the third to-be-removed portion Sw3 is greater than the sum of the fit tolerance of the bonding technique and the maximum cutting error; therefore, even if the maximum deviation occurs in each bonding process and cutting process, the touch layer 30 can still be cut during the cutting process so as to ensure that the end surfaces of the polarizer 10, the touch layer 30 and of the display panel 20 are flush with each other, which in turn is conducive to realization of narrow borders.

In one embodiment, when the reserved waste discharge width is 4 mm and the fit tolerance is 0.3 mm, the width of the third to-be-removed portion Sw3 is 0.5 mm, so that the manufacturing cost of the touch layer 30 is reduced, and the cutting effect is improved. In one embodiment, the width of the first to-be-removed inner region Sw11 of the polarizer 10 is 1 mm. That is, when the third reserved portion Sr3 of the touch layer 30 is accurately attached to the polarizer 10, a space of 0.5 mm exists between the touch layer 30 and the inner boundary of the first to-be-removed outer region Sw12. Thus, even if the deviation occurs during the bonding, the touch layer 30 will not touch the release film in the first to-be-removed outer region Sw12.

In the method for manufacturing the display apparatus provided by the present disclosure, as shown above, the display panel, the touch layer, and the polarizer are bonded together and then cut to achieve narrow borders. Furthermore, the width of the first to-be-removed portion of the low-cost polarizer is not less than the sum of the reserved waste discharge width, the maximum cutting error, and the fit tolerance. Therefore, even when deviation occurs during the cutting, aligning, and bonding processes, there is no problem of warp due to insufficient reserved width at the time of cutting. In addition, the width of the second to-be-removed portion of the display panel and the width of the third to-be-removed portion of the touch layer are designed to ensure that the display panel and the touch layer can be cut during the cutting to form flush end surfaces, which is conducive to the realization of narrow borders. Therefore, the present disclosure can reduce the manufacturing cost while realizing narrow borders. Furthermore, the embodiments of the present disclosure can not only eliminate the POL/Touch Sensor/OLED Panel bonding tolerances, but also maximize the utilization rate of Touch Sensor and OLED panel layout to reduce production costs.

Another example of the present disclosure is a display apparatus manufactured by the manufacturing method according to one embodiment of the present disclosure. The display apparatus can be any product or component having a display function, such as a mobile phone, a tablet computer, a television set, a display, a notebook computer, a digital photo frame, a navigator, and the like. The display apparatus can reduce the manufacturing cost while realizing narrow borders.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

DESCRIPTION OF SYMBOLS IN THE DRAWINGS

10: polarizer
11: polarizer body
12: release film
20: display panel
30: touch layer
40: cover plate
50: adhesive layer
Sr1: first reserved portion
Sr2: second reserved portion
Sr3: third reserved portion
Sw1: first to-be-removed portion
Sw11: first to-be-removed inner portion
Sw12: first to-be-removed outer portion
Sw2: second to-be-removed portion
Sw3: third to-be-removed portion

What is claimed is:
1. A method of manufacturing a display apparatus, comprising:
providing a polarizer and a display panel, the polarizer comprising a first reserved portion and a first to-be-removed portion surrounding the first reserved portion, and the display panel comprising a second reserved portion and a second to-be-removed portion surrounding the second reserved portion;

aligning and bonding the second reserved portion of the display panel with the first reserved portion of the polarizer; and cutting at least the polarizer along a boundary of the second reserved portion;

wherein a width of the first to-be-removed portion is not smaller than a first width, and a width of the second-to-be-removed portion is smaller than the first width, and the width of the second to-be-removed portion is greater than a second width, and the width of the first to-be-removed portion is not less than a sum of the first width and the second width.

2. The method of claim 1, wherein the polarizer comprises a polarizer body, an adhesive layer on the polarizer body, and a release film covering the adhesive layer.

3. The method of claim 1, before aligning the second reserved portion of the display panel with the first reserved portion of the polarizer, the method further comprising:

providing a touch layer, the touch layer comprising a third reserved portion and a third to-be-removed portion surrounding the third reserved portion; and aligning and bonding the third reserved portion of the touch layer and the first reserved portion of the polarizer;

wherein a width of the third to-be-removed portion is less than the first width and greater than a sum of a third width and the second width, and the width of the first to-be-removed portion is not less than a sum of the first width, the second width, and the third width.

4. The method of claim 3, wherein aligning and bonding the third reserved portion of the touch layer and the first reserved portion of the polarizer comprises:

removing the release film in a first to-be-removed inner portion and the first reserved portion of the polarizer, and the first to-be-removed portion comprising the first to-be-removed inner portion and a first to-be-removed outer portion; and aligning the third reserved portion of the touch layer with the first reserved portion of the polarizer and bonding the touch layer with an exposed part of the adhesive layer on the polarizer;

wherein a width of the first to-be-removed inner portion is greater than a sum of the width of the third to-be-removed portion and the third width.

5. The method of claim 4, wherein aligning and bonding the second reserved region of the display panel with the first reserved region of the polarizer comprises:

aligning and bonding the second reserved portion of the display panel and the third reserved portion of the touch layer.

6. The method of claim 5, cutting at least the polarizer along the boundary of the second reserved region by the cutting technique comprises simultaneously cutting the display panel, the touch layer, and the polarizer.

7. The method of claim 1, wherein the first width is between 4 mm and 5 mm, the second width is between 0.1 mm and 0.2 mm, and the width of the second to-be-removed portion of the display panel is between 0.3 mm and 1 mm.

8. The method of claim 7, wherein the width of the second to-be-removed portion of the display panel is about 0.5 mm.

9. The method of claim 3, wherein the first width is between 4 mm and 5 mm, the third width is between 0.28 mm and 0.3 mm, the second width is between 0.1 mm and 0.2 mm, and the width of the first to-be-removed region is between 5 mm and 6 mm.

10. The method of claim 9, wherein the first width is about 4 mm, the third width is about 0.3 mm, the second width is about 0.15 mm, and the width of the first to-be-removed portion is about 5 mm.

11. The method of claim 10, wherein the width of the third to-be-removed portion is about 0.5 mm.

12. The method of claim 4, wherein the width of the third to-be-removed portion of the touch layer is about 0.5 mm and the width of the first to-be-removed inner portion is about 1 mm.

13. The method of claim 5, wherein aligning and bonding the second reserved portion of the display panel and the third reserved portion of the touch layer comprises:

providing an adhesive layer on the touch layer; and aligning the second reserved portion of the display panel with the third reserved portion of the touch layer and bonding the display panel and the adhesive layer by the bonding technique.

14. The method of claim 1, wherein the display panel is a flexible OLED display panel.

15. The method of claim 1, the method further comprising bonding a cover plate with the polarizer on a side of the polarizer away from the display panel.

* * * * *